United States Patent [19]

Covill

[11] 4,156,212

[45] May 22, 1979

[54] COMBINER SYSTEM

[75] Inventor: Dennis H. Covill, Hackett's Cove, Canada

[73] Assignee: Nautical Electronic Laboratories, Ltd., Hackett's Cove, Canada

[21] Appl. No.: 862,058

[22] Filed: Dec. 19, 1977

[51] Int. Cl.² .............................................. H03H 7/48
[52] U.S. Cl. ..................................... 333/100; 333/124
[58] Field of Search ..................................... 333/6, 8, 9

[56] References Cited

U.S. PATENT DOCUMENTS

| 3,428,920 | 2/1969 | Oleksiak | 333/8 |
| 3,486,135 | 12/1969 | Sweeney | 333/9 |

Primary Examiner—Paul L. Gensler
Attorney, Agent, or Firm—Wenderoth, Lind & Ponack

[57] ABSTRACT

The present invention relates to a combiner network comprising n input terminals where n is a positive integer greater than 1. Each of the input terminals is connected to a first common point by a resistive element. n transformers are provided with each transformer having a primary and a secondary winding. Each of the n terminals is connected to one end of a primary winding in a one-to-one relationship. Each primary winding has a second end connected to a second common point wherein the secondary windings of the n transformers are connected in series to form a first and a second secondary terminal. The first secondary terminal is connected to the second common point. The second secondary terminal is an output terminal for the network. The primary and secondary windings of the n transformers have a turns ratio of n:1 so that when each of the n input terminals is fed by identical signals, zero net flux circulates in the n transformers.

5 Claims, 2 Drawing Figures

COMBINER SYSTEM

BACKGROUND OF THE INVENTION

The present invention relates to a combiner network. More particularly, the present invention relates to a combiner network that utilizes individual dissipative resistors which are all of the same power handling capability and which have a relatively low power handling requirement in relation to prior art combiner networks.

DISCUSSION OF THE PRIOR ART

U.S. Pat. No. 3,747,026, which issued on July 17, 1973 to Dennis H. Covill disclosed how a single transformer and its associated dissipating resistor could be connected to combine two separate coherent signals in a single composite signal while at the same time maintaining mutual isolation of the two coherent signals. That patent also disclosed that by connecting a binary cascade of these combiner networks, it was possible to combine any exact arithmetic power of $2^m$ sources together, where m is a positive integer.

U.S. Pat. No. 3,784,931, which issued on Jan. 8, 1974 to Dennis H. Covill disclosed how an alternative embodiment of the combiner shown in the first above mentioned United States Patent could be used to connect any number of sources together to yield a single composite output signal.

Both of the above mentioned patents disclose composite networks wherein the dissipating resistor varies in both its resistive value and in its power handling capability, depending on the location of the dissipative resistor in the network.

In particular the power handling capability of the resistors must increase as their position in the network approaches the final load.

SUMMARY OF THE INVENTION

The present invention eliminates this requirement by replacing the dissipating resistors of the known networks with a star configuration of resistors connecting each input to the combining network with a common point. In addition, the conventional combining network is replaced by a cascade arrangement of transformers which can combine n number of inputs to form a composite signal. Complete isolation can be obtained from input port to input port by selecting the correct resistance value of the star resistors with respect to the resistance value of the load and by selecting the correct turns ratio of the transformers. Under normal operating conditions each of the inputs to the combiner network is fed by an identical signal. Under this condition the voltages are all balanced across the dissipative resistors in the star network and no current flows in the star network. The transformer windings are dimensioned and connected so that no net flux circulates in each of the transformers and a mere addition of the input signals takes place. If the signal to one of the input ports fails current flows in the star network from the ports remaining operational to the port in which the signal has failed. This current flows into the transformer associated with the port in which the signal has failed. The quantity of that current is such as to maintain a zero net flux in the transformer. In this way complete isolation is maintained.

The cascade arrangement of transformers lends itself to an embodiment for use at high radio frequencies wherein the secondary windings of all of the transformers is in the form of a metal bar or tubular conductor with each of the primary windings wound around ferrite toroids which are located coaxially over the metal conductor secondary. A feed and termination wiring network is formed in a cylindrical shape and arranged over the secondary windings to form a coaxial arrangement which yields a broad band result with correct dimensioning.

It is an object of the present invention to provide a combiner network for combining n coherent radio frequency signals together to form a single composite output signal where the dissipative elements are all of the same size both with respect to their resistance and with respect to their power handling capabilities. It is a further object of the present invention to provide a combiner network wherein the network can be made as a single coaxial apparatus wherein the secondary of all of the combining transformers is a single element with the primary of each of the transformers located thereon.

In accordance with the present invention there is provided a combiner network comprising n input terminals where n is a positive integer greater than 1, each input terminal being connected to a first common point by a resistive element; n transformers each having a primary and a secondary winding, each of said n terminals being connected to one end of a primary winding in a one-to-one relationship, each primary winding having a second end connected to a second common point, wherein the secondary windings of said n transformers are connected in series to form a first and a second secondary terminal, said first secondary terminal being connected to said second common point, said second secondary terminal being an output terminal for said network, said primary and said secondary windings of said n transformers having a turns ratio of n:1 so that when each of said n input terminals is fed by identical signals, zero net flux circulates in said n transformers.

In accordance with another aspect of the present invention there is also provided a combiner structure comprising an elongated cylindrical conducting member; n annular ferrite cores spaced along said member, where n is a positive integer greater than 1; a winding wound on each of said cores, each winding having an input end and an output end; n input terminals located in a circular pattern in a plane which is oriented substantially perpendicular to said member at one end of said member; an input wire network connecting each of said n terminals to a winding input end in a one-to-one relationship said network forming n straight parallel wires arranged in a circular pattern about said member, an output wire network formed of a first section having n straight wires with each wire being connected to a winding output end in a one-to-one relationship, said n wires arranged in a circular pattern and running parallel to said member to the other end of said member and a second section wherein said n wires of said output network run in a plane perpendicular to said member to connect to said member at said other end; and n resistive elements each having a first and a second end, said first end of each element being connected to one of said n input terminals with each second end being connected to a common point, said one end of said member being an output terminal of said combiner structure.

DESCRIPTION OF THE PREFERRED EMBODIMENTS

Figure 1:
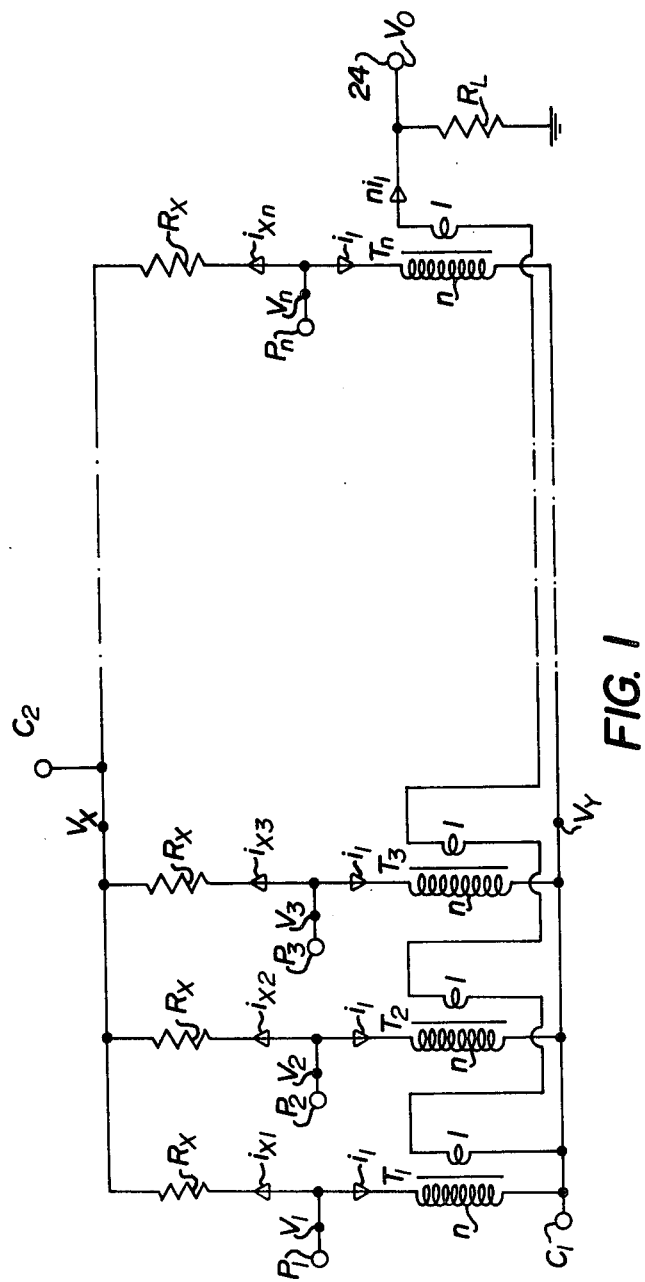
FIG. 1 is a schematic diagram of a combiner network according to the present invention.

Referring to FIG. 1 a combiner network is shown having n input ports $P_1$, $P_2$, $P_3$ ... $P_n$. Each input port is connected, in a one-to-one relationship, with one terminal of a primary winding of a transformer $T_1$, $T_2$, $T_3$ ... $T_n$. The other terminal of each of the primary windings of the n transformers is connected to a common point $C_1$. The secondary winding of each of the n transformers is connected in series with one end of the secondary winding of the first transformer connected to the common point $C_1$ and one end of the secondary winding of the nth transformer constituting the output terminal 24 of the network. The output terminal 24 is connected, in operation, to a load, for example a transmitting antenna having a resistance $R_L$. The primary and secondary windings of each transformer are connected so that the primary and secondary currents produce opposing magnetizing fluxes. In each transformer the primary magnetizing ampere turns is equal to $ni_1$ (n turns $xi_1$ amperes). Through each transformer secondary, the addition of all n primary currents flows to the output load ($R_L$). Hence the secondary magnetising ampere turns is also equal to $ni_1$ (1 turn $\times ni_1$ amperes) and thus complete flux cancellation occurs within each transformer. With this flux cancellation it may be deduced that the transformers produce no impedance barrier between the output load and the input ports.

The n resistors $R_x$ each connected between an input port and common point $C_2$ comprise a star network. Currents $i_{x1}$, $i_{x2}$ ... $i_{xn}$ flow through this star network in the general case but in the normal operating condition, where all input ports are driven by identical voltages and currents, all points of the star are at equi-potential and $i_{x1}$, $i_{x2}$ ... $i_{xn}$ are all zero. Under this condition $V_1$, $V_2$ ... $V_n$ are all equal to each other and also to the output voltage $V_o$. Thus the impedance at each input port is equal to $nR_L$.

If we now consider that the input current supplied to one of the ports (say the nth port) is removed and also postulate that the transformers $T_1$, $T_2$ ... $T_n$ have idealized characteristics (infinite inductance and unity coupling), then:

$$V_1 = V_2 = V_3 \ldots = V_{n-1}$$

$$i_{x1} = i_{x2} = I_{x3} \ldots = i_{x(n-1)} = 1/R_x(V_1 - V_x)$$

$$i_{xn} = -i_1 \text{ (idealized transformer condition)}.$$

From the star network volt-current relations:

$$i_{x1}(n-1) = -i_{xn} = i_1 \tag{1}$$

$$V_n = V_1 - i_1 R_x(n/n - 1) \tag{2}$$

From the transformer voltage relationships:

$$V_Y + \frac{V_1 - V_Y}{n}(n-1) + \frac{V_n - V_Y}{n} = V_o = ni_1 R_L$$

which reduces to:

$$V_n = n^2 i_1 R_L + (1-n) V_1 \tag{3}$$

Solving equations (2) and (3) for $V_n$ we obtain:

$$V_n = i_1(nR_L - R_x) \tag{4}$$

If now $R_x$ is chosen to equal $nR_L$, then from equation (4), $V_n = o$ and hence input port isolation is established.

From the above equations and taking $R_x = nR_L$ it may also be deduced:

$$V_o = n - 1/n(V_1)$$

and input impedance at any active port $= V_1/(i_1 + i_{x1}) = R_x = nR_L$

There is, of course, still input port isolation if the input currents to more than one port fail.

Figure 2:
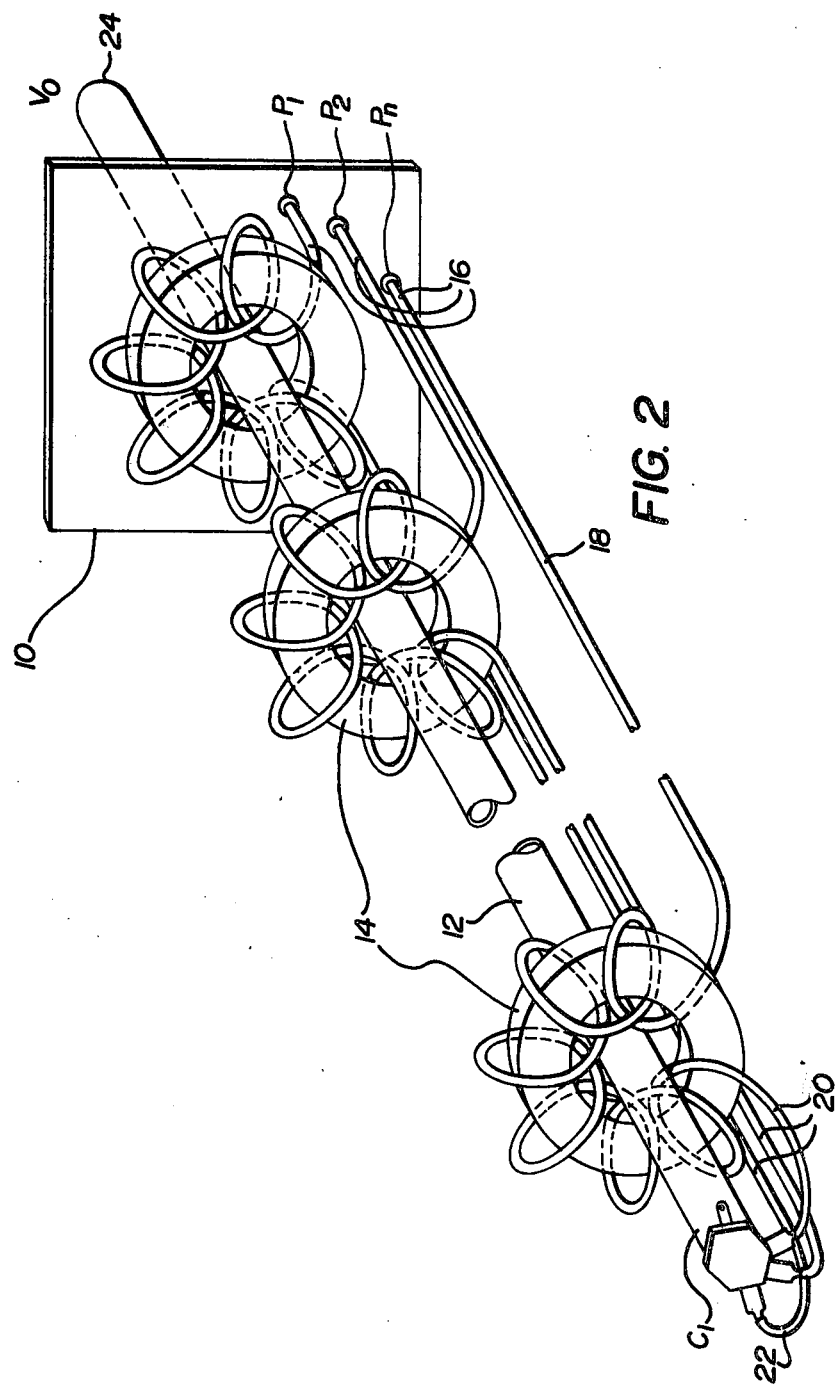
FIG. 2 is a diagrammatic representation of a combiner network formed as a single apparatus in accordance with the present invention.

FIG. 2 shows a particular physical realization of the network described in FIG. 1. A collar 10 holds the n input terminals $P_1$ to $P_n$, only three being shown to simplify the drawing. The secondary of all of the transformers $T_1$-$T_n$ shown in FIG. 1 is in the form of a tubular metal conductive rold 12 which constitutes a single turn secondary for each transformer. The primary windings are wound around toroidal cores 14. Since there are n input terminals there will be n toroidal cores and n windings with each winding consisting of n turns.

An input network structure is provided which connects each of the n terminals to one end of a primary winding in a one-to-one relationship. The input network structure is arranged in a tubular form coaxial with the conductive rod 12. The input network structure is generally indicated by 16 in FIG. 1 containing conductive elements 18.

An output network structure 20 having conductive elements 22 is also shown in FIG. 2. The output network structure connects the other end of each of the n primary windings to common point $C_1$ located at one end of the conductive rod 12. The output network structure is arranged in a tubular form coaxial with the rod 12. Each element 22 turns into a plane perpendicular to the axis of rod 12 at the end of rod 12 to join with common point $C_1$ which may be, for example, a bolt with solder lugs secured in the end of tube 12.

The opposite end of rod 12 forms the output terminal of the network. This terminal is identified as 24 in FIG. 2. The resistive network shown in FIG. 1 connects each of the n input ports shown in FIG. 2 to a second common point which may or may not be connected to the output terminal 24 which is at the same potential. The resistive network has not been shown in FIG. 2 in order to make the drawing clear and uncluttered. The coaxial arrangement of elements shown in FIG. 2 provides a broad band radio frequency combining network.

Although FIG. 2 shows rod 12 as tubular it could, of course, be solid.

What I claim as my invention is:

1. A combiner network comprising n input terminals where n is a positive integer greater than 1, each input terminal being connected to a first common point by a resistive element; n transformers each having a primary and a secondary winding, each of said n terminals being connected to one end of a primary winding in a one-to-one relationship, each primary winding having a second end connected to a second common point, wherein the secondary windings of said n transformers are connected in series to form a first and a second secondary terminal, said first secondary terminal being connected to said second common point, said second secondary terminal being an output terminal for said network, said primary and said secondary winding of said n transformers having a turns ratio of n:1 so that when each of said n input terminals is fed by identical signals, zero net flux circulates in said n transformers.

2. A combiner network according to claim 1 wherein said output terminal is adapted for connection to a load having a resistance $R_L$ and wherein each of said n resistive elements has a resistance $nR_L$.

3. A combiner structure comprising an elongated cylindrical member; n annular ferrite cores spaced along said member, where n is a positive integer greater than 1; a winding wound on each of said cores, each winding having an input end and an output end; n input terminals located in a circular pattern in a plane which is oriented substantially perpendicular to said member at one end of said member; an input wire network connecting each of said n terminals to an input end in a one-to-one relationship, said network forming n straight parallel wires arranged in a circular pattern about said member, an output wire network formed of a first section having n straight wires with each wire being connected to an output end in a one-to-one relationship, said n straight wires arranged in a circular pattern and running parallel to said member to the other end of said member and a second section wherein said n wires of said output network run in a plane perpendicular to said member to connect to said member at said other end; and n resistive elements each having a first and a second end, said first end of said element being connected to one of said n input terminals with each second end being connected to a common point, said one end of said member being an output terminal of said combiner structure.

4. A combiner structure according to claim 3 wherein said output terminal is adapted for connection to a load having a resistance $R_L$ and wherein the resistance of each of said n resistive elements is $nR_L$.

5. A combiner according to claim 4 wherein each of said windings has n turns.

* * * * *